United States Patent [19]

Kaplan et al.

[11] 3,982,148

[45] Sept. 21, 1976

[54] HEAT RADIATING COATING AND METHOD OF MANUFACTURE THEREOF

[75] Inventors: Richard B. Kaplan, Hollywood; Sebastian Gonnella, Arleta; Walter M. Abrams, Van Nuys, ail of Calif.

[73] Assignee: Ultramet, Pacoima, Calif.

[22] Filed: May 7, 1975

[21] Appl. No.: 570,281

[52] U.S. Cl. ............................... 313/330; 313/40; 313/41; 313/309; 313/351; 427/65; 427/160; 313/55

[51] Int. Cl.² ........................................ H01J 35/08

[58] Field of Search .......... 313/330, 309, 351, 336, 313/40, 41, 55; 427/35, 36, 65, 58, 160

[56] References Cited
UNITED STATES PATENTS

| | | | |
|---|---|---|---|
| 2,071,696 | 2/1937 | Jonas | 313/40 |
| 2,607,016 | 8/1952 | Kennebeck | 313/351 X |
| 3,174,043 | 3/1965 | Dyke et al. | 313/309 X |
| 3,453,478 | 7/1969 | Shoulders et al. | 313/336 X |
| 3,819,971 | 6/1974 | Kaplan et al. | 313/330 |
| 3,821,581 | 6/1974 | Holland et al. | 313/330 |
| 3,869,634 | 3/1975 | Konieczynski et al. | 313/330 |

FOREIGN PATENTS OR APPLICATIONS 947,998 8/1956 Germany ........................... 313/330

Primary Examiner—Saxfield Chatmon, Jr.
Attorney, Agent, or Firm—Edwin A. Oser

[57] ABSTRACT

A heat radiating coating of rhenium for a refractory core which may be used for a rotating X-ray anode, power tube or the like. The coating is characterized by a multiplicity of needle-like radiation-reflecting elements disposed adjacent to each other. The needles have such steep angles that incoming radiation is substantially absorbed thereby by repeated reflection. Since the coating has a high radiation absorption coefficient it has a corresponding high emissivity on the order of 0.9 at elevated temperatures. A process is disclosed for depositing such a heat radiating coating of rhenium by chemical vapor deposition.

5 Claims, 4 Drawing Figures

HEAT RADIATING COATING AND METHOD OF MANUFACTURE THEREOF

BACKGROUND OF THE INVENTION

This invention relates generally to a heat radiating coating for a refractory core and a method of manufacture thereof, and particularly relates to such a coating suitable, for example, for the rotating anode of an X-ray tube, high power tubes and the like, and capable of withstanding the high vacuum and high temperatures encountered in such environments.

For many applications such as high power tubes and X-ray tubes, it is imperative to have a material capable of radiating heat with high efficiency. For example, in an X-ray tube of the type having a rotating anode, the electron beam bombards a track on the anode which in turn radiates the X-rays. However, most of the incoming energy is transformed into heat. Hence the efficiency of the reradiation of heat from the anode determines how often the tube can be pulsed or how much energy can be applied thereto as a function of time.

For example, for modern X-ray techniques rapid and repetitive exposures are required to obtain the desired results. This is particularly true of angiography or cineradiography. Similar considerations apply for high power tubes.

In the past various materials capable of withstanding high temperatures have been used, for example, for the anode or the anode coating of X-ray tubes. Generally, such materials as tungsten and rhenium or composites thereof have been proposed. These materials not only are capable of withstanding high temperatures, but are also good X-ray emitters due to their high atomic numbers.

For example, the U.S. Pat. No. 3,649,355 to Hennig describes a process for coating a refractory core for the purpose of providing a rotating X-ray anode. It is proposed that tungsten or tungsten alloys are deposited from a gaseous phase and such vapor deposition to produce tungsten coatings is generally known. The refractory core may, for example, consist of graphite or other suitable materials.

The U.S. Pat. No. 2,863,083 to Schram also discloses anodes for X-ray tubes. Specifically, it is proposed to make the anode either entirely of rhenium or to provide it with a coating of rhenium. One of the processes recommended is the chemical vapor deposition of rhenium by decomposing a halogenide of rhenium such as rhenium pentachloride at a temperature between 500 and 1500°C (centigrade) in vacuum. However, the emissivity of such a coating disclosed by Schram is no more than about 0.3. It is also proposed by Schram that the non-focal surface be blackened by a known process not further specified, apparently in an effort to increase the heat radiation properties of the coating.

The anode may consist of a refractory core, for example molybdenum or graphite. In some cases an intermediate layer is provided between the outer rhenium coating and the refractory core and the intermediate layer may, for example, consist of tungsten or the like.

Reference is also made to the prior U.S. Pat. to Kaplan et al. No. 3,819,971. This patent deals with a composite anode for X-ray tubes where the coating is retained to the core by means of scoring the surface of the core or similar means. This patent also discloses a process for the chemical vapor deposition of rhenium, for example, from rhenium hexafluoride or rhenium pentachloride. The rhenium hexafluoride reaction is carried out at 800°C and for the rhenium pentachloride at about 1000°C. However, none of these prior coatings have a really high emissivity, where the maximum possible emissivity is 1.0 as in a perfect black body radiator. In other words, the actual emissivity is less than one third of the theoretical emissivity.

It is accordingly an object of the present invention to provide a coating consisting of rhenium for a refractory core which has superior heat radiating properties, that is an emissivity on the order of 0.9.

Another object of the present invention is to provide such a coating which consists of radiation reflecting needle-like elements which due to their steep angles will reflect radiation out of the coating to provide a high degree of radiation and a correspondingly high emissivity.

A further object of the present invention is to provide a process of depositing such a heat radiating coating of rhenium by the vapor deposition of the rhenium in the form of a halogenide of rhenium.

SUMMARY OF THE INVENTION

A heat radiating coating for a refractory core in accordance with the present invention consists of a layer of rhenium having a thickness of no less than about 25 microns. They layer further has a heat radiating emissivity on the order of 0.9 at a temperature on the order of 1000°C (centigrade). The coating may cover all or part of the refractory core. For example, it may be desired to provide a different material or coating for the focal track of a rotating X-ray anode. The coating further consists of a multiplicity of needle-like radiation-reflecting elements disposed adjacent to each other. The needle-like elements have such steep angles that incoming radiation is substantially absorbed thereby by reflection and accordingly the coating will similarly reradiate heat coming from the core by a reciprocal process. Due to its radiation absorbing character the coating appears black to the naked eye while nevertheless the needles reflect radiation. When viewed through a low powered microscope, the individual needles appear as highly reflecting surfaces.

A process is also described for depositing such a heat radiation coating of rhenium from a halogenide of rhenium such as rhenium pentachloride or rhenium hexafluoride.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

BRIEF DESCRIPTION OF THE DRAWING

FIG. 4 is a reproduction of a microphotograph of 2000 X enlargement of the coating of the present invention illustrating the needle-like elements above referred to.

DESCRIPTION OF THE PREFERRED EMBODIMENTS

Figure 1:
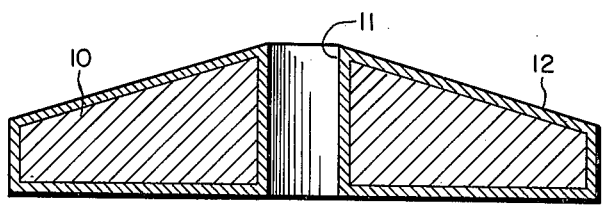
FIG. 1 is a cross-sectional view of a rotatable anode of an X-ray tube embodying the coating of the present invention.

Referring now to FIG. 1 there is illustrated a conventional anode for a rotating anode of an X-ray tube provided with the coating of the invention. Thus, the anode includes a refractory core 10 having a central aperture 11 through which may pass a rod and a screw, the rod being connected to a motor for rotating the anode. The refractory core 10 may, for example, consist of molybdenum, tungsten, or a composite of rhenium, tungsten and molybdenum. Instead of a metal the core may consist of other refractory materials such as graphite or a ceramic such, for example, as silicon carbide, boron carbide or boron nitride. In some cases it may be desirable to provide an intermediary layer between the refractory core 10 and the outer core 12 not illustrated. Such an intermediary layer may, for example, consist of tungsten or similar materials. However, the term refractory core is meant to include both the core and an intermediary layer if present.

In accordance with the present invention the core 10 is provided with an outer coating 12 which consists of rhenium and which has certain properties which make it uniquely suitable for use in high power tubes and X-ray tubes. In particular, the coating has a very low vapor pressure and is capable of withstanding the high vacuum, as well as the high temperatures encountered in such tubes.

Figure 2:
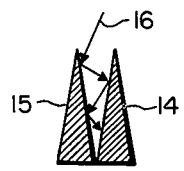
FIG. 2 is a schematic greatly enlarged view of two of the needle-like elements of the coating of the invention showing the path of a light ray entering the structure.
Figure 4:
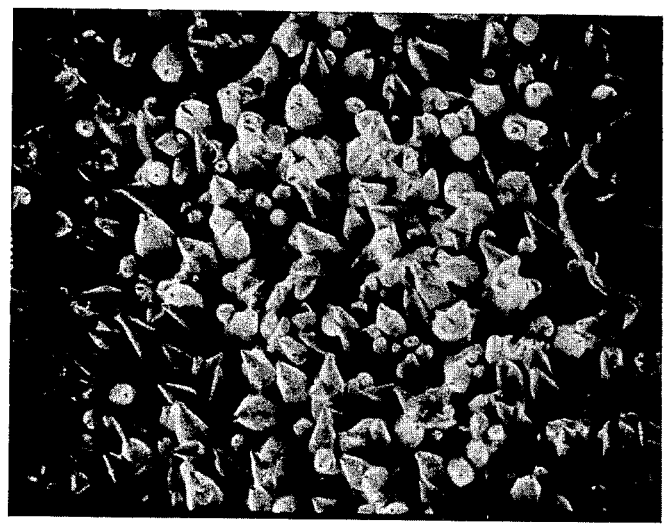

The coating consists of a multiplicity of needle-like radiation-reflecting elements of the type illustrated in the electron photomicrograph of FIG. 4. It is these needle-like elements which give the coating its unique properties. As shown schematically in FIG. 2, there are two adjacent needles 14 and 15 with relatively steep angles. A light ray 16 entering the valley between the two needles 14, 15 is successively reflected downwardly until it is finally absorbed. Assuming, for example, that the surfaces reflect 70% of the impinging light, then 30% of the light is absorbed as heat. Because the incoming light ray 16 is successively reflected downward, less and less light remains to be reflected so that substantially all of the light is eventually absorbed.

This is the reason that the emissivity is on the order of 0.9. In any black body or near ideal black body a high heat absorption corresponds to a high emissivity of heat. This phenomenon is well understood from basic physics. Substantially all of the light which impinges at an angle between 90° and say 20° to a horizontal plane is thus substantially reflected until completely absorbed. Conversely, the heat of the anode is substantially completely reradiated. Thus referring again to FIG. 2 when the coating is heated the heat radiation will be reflected as shown by the light ray 16 except that the direction of travel is reversed. Instead of the light ray being partially absorbed during each reflection additional heat radiation will emerge at each reflection point, thereby to increase the emissivity. This process is particularly efficient at the elevated temperature at which the coating is to be used. This is true because most of the heat is radiated in the form of visible light and infrared.

Due to its light absorbing character the coating appears black to the naked eye. However, when viewed under a light microscope the needle-like structure does reflect radiation and appears as highly reflective tiny mirrors.

Because of the needle-like structure required the coating 12 should have a thickness no less than about 25 microns so that the needles can form the proper aspect ratio. In general, it is desired to have as thin a coating as possible because rhenium is an expensive metal. Actually, the coating may be as thick as 250 microns. For example, the patent to Schram above referred to suggests a coating of a thickness of 10 microns which is not thick enough to permit the needle-like structure of the coating of the invention to form.

The coating of the present invention may be deposited in the following manner. A gaseous mixture of rhenium pentachloride and argon may be introduced into a vacuum chamber or the reaction may take place at atmospheric pressure in a reaction chamber. The reaction chamber contains a heated substrate or refractory core upon which the coating is to be applied. The core or substrate is heated to a temperature in the range between about 900°C and about 1100°C. This temperature range is within the temperature range where the reaction takes place viz 850° to 1400°C. Accordingly, the following reaction takes place:

$$2 \text{ Re Cl}_5 \rightarrow 2 \text{ Re} + 5 \text{ Cl}_2 \tag{1}$$

Optionally the reaction may take place in the presence of argon or another noble gas.

For reasons of speed and economy it is usually desired to maintain the reaction efficiency as high as possible. However, in accordance with the present invention the reaction efficiency is held at no more than about 60%. This, of course, means that there must be an excess of the rhenium pentachloride.

These conditions are essential for the deposition of a rhenium coating with the properties previously enumerated. Normally, as explained, it is desirable to maintain the reaction efficiency as high as possible. Furthermore, the usable deposition temperature range is much wider than that appropriate for the growth of the needle-like structure.

Instead of carrying out the reaction with rhenium pentachloride, other halogenides of rhenium may be used for the vapor deposition. Thus, the reaction may also be carried out with rhenium hexafluoride and hydrogen in which the reaction procedure is as follows:

$$\text{Re F}_6 + 3 \text{ H}_2 \rightarrow \text{Re} + 6\text{HF} \tag{2}$$

As will be seen from reaction (2) hydrogen fluoride forms and the pure rhenium remains and is deposited. This process is generally carried out in the same manner with a reaction efficiency of no more than about 60%, that is with an excess of rhenium hexafluoride.

In order for the reaction to take place and the needle-like structure to form the substrate is heated to a temperature between about 750° and about 900°C. Actually, this reaction can take place over a temperature range of 500° to 1500°C. Nevertheless, the temperature range is limited in accordance with the present invention to produce the desired results.

Figure 3:
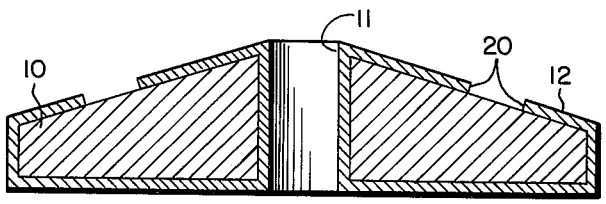
FIG. 3 is a cross-sectional view similar to that of FIG. 1 but with the coating omitted at the focal track of the anode.

Referring now to FIG. 3, there is illustrated a modified anode in accordance with the present invention. The anode again comprises a refractory core 10 having a central aperture 11 and a coating 12. However, the focal track 20 has not been covered with the coating of rhenium and instead some other material may be used.

Thus, the focal track may, for example, be covered with a layer of tungsten or a composite of tungsten and rhenium. It will be understood that the coating 12 of the present invention will reradiate most of the heat introduced, for example, into the focal track 20 of the anode. Similar considerations apply for the anode of a high power tube.

It will also be understood that instead of omitting the rhenium coating of the invention at the focal track 20, it is feasible to deposit tungsten or tungsten-rhenium over the initial coating 12 which has not been illustrated.

There has thus been disclosed a heat radiating coating consisting of a layer of rhenium with unique properties. The rhenium layer consists of needle-like radiation-reflecting elements. As a result the heat radiation emissivity is on the order of 0.9. The coating entirely or partially covers a conventional refractory core. A vapor deposition process has been disclosed for providing such a coating with these unique properties. The process may, for example, be carried out with a halogenide of rhenium such as rhenium pentachloride or rhenium hexafluoride.

What is claimed is:

1. A heat radiating coating for a refractory core, said coating consisting of a layer of rhenium having a thickness of no less than about 25 microns and a heat radiating emissivity on the order of 0.9, said coating covering at least a portion of the core and consisting of a multiplicity of needle-like radiation-reflecting elements disposed adjacent to each other and at such steep angles that outgoing radiation is reflected until substantially all heat is released from the core.

2. A rotating X-ray anode comprising:
   a. a core of refractory material having approximately the shape of a disk; and
   b. a heat radiating coating provided over at least a portion of the surface of said core, said coating consisting of a layer of rhenium having a thickness of no less than about 25 microns, said coating having a needle-like structure with closely adjacent radiation-reflecting needles having relatively steep angles, so that outgoing radiation is reflected between adjacent needles and heat is radiated at an overall emissivity on the order of 0.9.

3. The process of depositing a heat radiating coating of rhenium on a refractory core, the process comprising the steps of:
   a. introducing a vapor of rhenium pentachloride into a reactor;
   b. heating the refractory core to a temperature between about 900° and about 1100°C while carrying out the reaction at an efficiency of no more than about 60%; and
   c. depositing a layer of rhenium having a thickness no less than about 25 microns, whereby the deposited coating is characterized by a needle-like structure having a radiation-reflecting surface capable of either absorbing heat radiation or reradiating it with an emissivity on the order of 0.9.

4. The process defined in claim 3 wherein a noble gas is added to the vapor of rhenium pentachloride.

5. A process of depositing a heat radiating coating of rhenium on a refractory core, the process comprising:
   a. introducing rhenium hexafluoride and hydrogen into a reaction chamber;
   b. heating the refractory core to a temperature between about 750° and about 900°C; and
   c. carrying out the reaction at an efficiency of no more than about 60% until a layer has been deposited no less than about 25 microns thick, whereby the thus obtained coating is characterized by a needle-like structure having a radiation-reflecting surface capable of absorbing or emitting radiation with a high efficiency.

* * * * *